(12) United States Patent
Soussan et al.

(10) Patent No.: US 8,629,721 B2
(45) Date of Patent: Jan. 14, 2014

(54) OUTPUT STAGE FORMED INSIDE AND ON TOP OF AN SOI-TYPE SUBSTRATE

(75) Inventors: Dimitri Soussan, Grenoble (FR); Sylvain Majcherczak, St. Pierre D'Allevard (FR)

(73) Assignee: STMicroelectronics SA, Montrouge (FR)

( * ) Notice: Subject to any disclaimer, the term of this patent is extended or adjusted under 35 U.S.C. 154(b) by 96 days.

(21) Appl. No.: 13/333,862

(22) Filed: Dec. 21, 2011

(65) Prior Publication Data

US 2012/0182070 A1    Jul. 19, 2012

(30) Foreign Application Priority Data

Jan. 14, 2011  (FR) ...................................... 11 50313

(51) Int. Cl.
*H03F 3/16* (2006.01)
*H03F 3/26* (2006.01)

(52) U.S. Cl.
USPC ......................................................... 330/264

(58) Field of Classification Search
USPC ................... 330/251, 264, 269, 277; 327/389
See application file for complete search history.

(56) References Cited

U.S. PATENT DOCUMENTS

| | | | |
|---|---|---|---|
| 5,434,526 A | 7/1995 | Tanigashira et al. | |
| 5,644,266 A * | 7/1997 | Chen et al. | 327/534 |
| 6,291,857 B1 | 9/2001 | Hirano | |

FOREIGN PATENT DOCUMENTS

JP         7086917 A    3/1995

* cited by examiner

*Primary Examiner* — Steven J Mottola
(74) *Attorney, Agent, or Firm* — Seed IP Law Group PLLC

(57) ABSTRACT

A method for controlling an output amplification stage comprising first and second complementary SOI-type power MOS transistors, in series between first and second power supply rails, the method including the steps of: connecting the bulk of the first transistor to the first rail when the first transistor is maintained in an off state; connecting the bulk of the second transistor to the second rail when the second transistor is maintained in an off state; and connecting the bulk of each of the transistors to the common node of said transistors, during periods when this transistor switches from an off state to an on state.

16 Claims, 3 Drawing Sheets

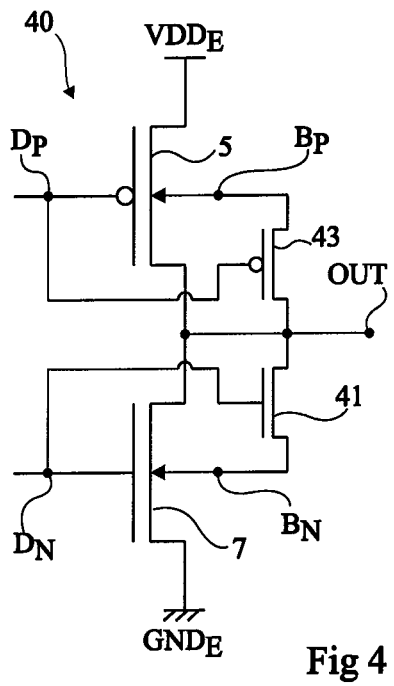
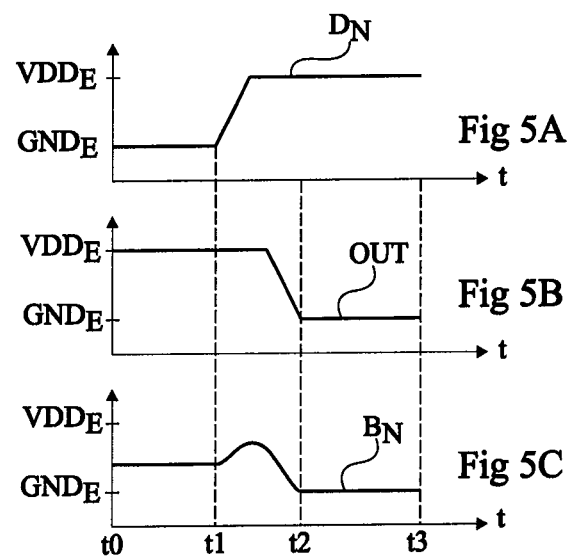
Fig 5A
Fig 5B
Fig 5C
Fig 4
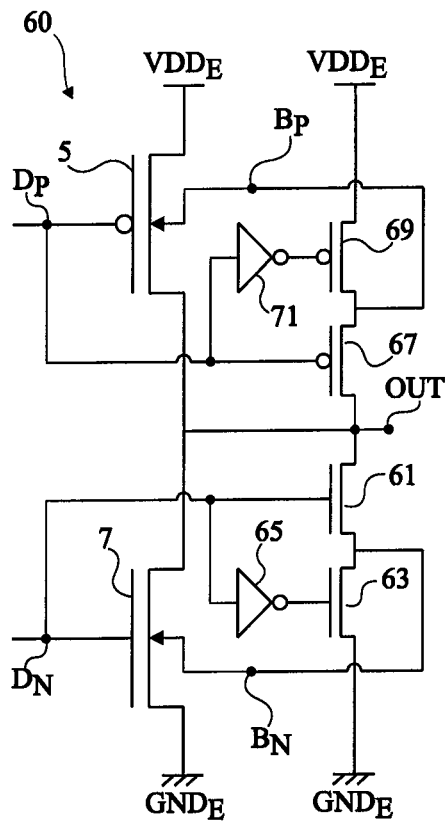
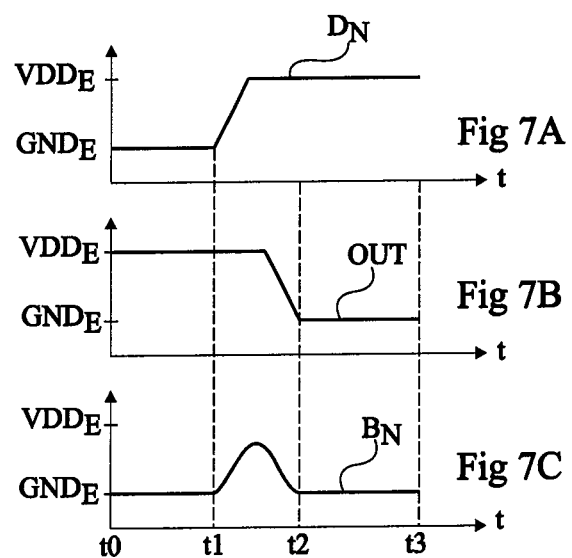
Fig 7A
Fig 7B
Fig 7C
Fig 6

OUTPUT STAGE FORMED INSIDE AND ON TOP OF AN SOI-TYPE SUBSTRATE

BACKGROUND

1. Technical Field

The present disclosure relates to an amplification stage associated with an output pad of an integrated circuit chip formed inside and on top of a substrate of semiconductor-on-insulator type.

2. Description of the Related Art

FIG. 1 is an electric diagram of an example of an amplification stage associated with an output pad of an integrated circuit chip. The amplification stage receives, on an input terminal IN, a data signal $D_{INT}$ generated by circuits (not shown) of the chip, and delivers, on an output terminal OUT connected to an output pad (not shown) of the chip, a signal $D_{EXT}$ capable of being exploited outside of the chip. Signal $D_{INT}$ is a digital signal capable of alternating between a high value and a low value. Signal $D_{EXT}$ follows the variations of signal $D_{INT}$, but at a higher voltage level, and with a power and an impedance adapted to a connection to an external device. The high and low values of signal $D_{INT}$ substantially correspond to respective high and low voltages $VDD_I$ and $GND_I$ for powering the logic circuits of the chip. The high and low values of signal $D_{EXT}$ substantially correspond to respective high and low voltages $VDD_E$ and $GND_E$ for powering the output stages of the chip. As an example, voltages $VDD_I$ and $GND_I$ respectively are on the order of 1.2 V and 0 V, and voltages $VDD_E$ and $GND_E$ respectively are on the order of 2.5 V and 0 V.

The output amplification stage comprises a pre-amplification stage 1 and a power and impedance matching stage 3. Stage 3 comprises a P-channel MOS power transistor 5, in series with an N-channel MOS power transistor 7. The sources of transistors 5 and 7 are respectively connected to high ($VDD_E$) and low ($GND_E$) power supply rails, and the drains of transistors 5 and 7 are connected to node OUT. Thus, when transistors 5 and 7 are respectively on and off, node OUT is at a voltage close to $VDD_E$, and when transistors 5 and 7 are respectively off and on, node OUT is at a voltage close to $GND_E$. Transistors 5 and 7 are selected to provide a power and an impedance adapted to an exploitation of signal $D_{EXT}$ outside of the chip.

Pre-amplification stage 1 receives signal $D_{INT}$, and provides a control signal $D_P$ to the gate of transistor 5 and a control signal $D_N$ to the gate of transistor 7. Stage 1 comprises a first branch between terminal IN and the gate of transistor 5, providing signal $D_P$, and a second branch between terminal IN and the gate of transistor 7, providing signal $D_N$. Each branch comprises a voltage step-up circuit, respectively $\mathbf{9}_P$ and $\mathbf{9}_N$, capable of converting signal $D_{INT}$ into an intermediary signal of same shape but pre-amplified to voltage level $VDD_E$, $GND_E$. Circuits $\mathbf{11}_P$ and $\mathbf{11}_N$ are respectively provided between the output of circuit $\mathbf{9}_P$ and the gate of transistor 5, and between the output of circuit $\mathbf{9}_N$ and the gate of transistor 7, to control the rising and falling edges of the pre-amplified intermediary signal. The function of circuits $\mathbf{11}_P$ and $\mathbf{11}_N$ especially is to prevent the possibility for transistors 5 and 7 to be turned on at the same time during the switching, which would result in short-circuiting the output stage power supply. As an example, the falling edges of signal $D_P$ may be slightly delayed with respect to the falling edges of signal $D_N$, and the rising edges of signal $D_N$ may be slightly delayed with respect to the rising edges of signal $D_P$. Further, circuits $\mathbf{11}_P$ and $\mathbf{11}_N$ operate as inverters, that is, signals $D_P$ and $D_N$ are in phase opposition with respect to signal $D_{INT}$.

Since the power and impedance matching stage (transistors 5 and 7) itself operates as an inverter, this enables for signal $D_{EXT}$ to be in phase with signal $D_{INT}$.

An amplification stage associated with an output pad of an integrated circuit chip formed inside and on top of a substrate of semiconductor-on-insulator type is here considered. Such a substrate, generally called SOI, comprises an active semiconductor layer, for example, an epitaxial silicon layer, coating an insulating layer. In SOI technology, it can be selected from among two types of transistors, transistors with a floating bulk and transistors having a bulk capable of being biased via a contacting area.

FIGS. 2A to 2C schematically show an N-channel MOS transistor 20, with a floating bulk, formed in an SOI-type substrate. FIG. 2A is a top view, FIG. 2B is a cross-section view along axis B-B, and FIG. 2C is a cross-section view along axis C-C.

Transistor 20 is formed inside and on top of a P-type semiconductor region 21 coating an insulating layer 22. Transistor 20 takes up, in top view, an approximately rectangular surface area delimited by vertical insulating walls 23. The well formed by layer 22 and walls 23 fully insulates transistor 20 from the other chip components. N-type regions 24 and 25, forming the source (S) and the drain (D) of the transistor, extend longitudinally on either side of an insulating layer 26, formed at the surface of region 21 and coated with a conductive gate 27 (G). Metallizations (not shown) may be provided on the source and drain regions. No contacting is provided to bias bulk 21 (B), which thus remains floating.

FIGS. 3A to 3C schematically show an N-channel MOS transistor 30, formed in an SOI-type substrate having a bulk capable of being biased via a contacting area. FIG. 3A is a top view, FIG. 3B is a cross-section view along axis B-B, and FIG. 3C is a cross-section view along axis C-C.

Transistor 30 is formed inside and on top of a P-type semiconductor region 31 coating an insulating layer 32. Transistor 30 takes up, in top view, an approximately rectangular surface area delimited by vertical insulating walls 33. N-type regions 34 and 35, forming the source (S) and the drain (D) of the transistor, extend longitudinally on either side of an insulating layer 36 coated with a conductive gate 37 (G). A heavily-doped P-type region 38 is formed in the upper part of a portion of region 31 which is not coated with gate 37. Region 38 enables to bias bulk 31 (B) of the transistor to a desired reference voltage. Region 38 may be coated with a contact metallization (not shown).

It has been suggested to form an output amplification stage of the type described in relation with FIG. 1, in which transistors 5 and 7 of the power and impedance matching stage are floating-bulk transistors. Floating-bulk transistors have the advantage of having shorter switching times. Indeed, since the bulk region is not connected to a reference voltage, electric charges are capable of building up therein. In an N-channel transistor, the building up of such positive charges results in increasing the voltage of the bulk region, and thus in decreasing the threshold voltage of the transistor. This results in faster switchings of the transistor when signal $D_N$ switches state. Similarly, in a P-channel transistor, negative charges tend to build up in the bulk region, thus resulting in faster switchings when signal $D_P$ switches state.

The use of transistors with a floating bulk however has several disadvantages. A first disadvantage is the history effect due to the lack of biasing of the bulk. At a given time, the bulk voltage partly depends on the on or off states successively taken by the transistor at previous times. Thus, the threshold voltage of the transistor fluctuates according to the states taken by the data signal at previous times. As a result, even though switching times are short, they are subject to a strong dispersion. A second disadvantage is that the building up of charges in the bulk region increases leakage currents when the transistor is off. In particular, in an N-channel transistor, the building up of positive charges in the bulk region results in forward biasing the junction formed between the bulk and the source. As an example, a positive voltage of a few tenths of a volt may settle between the bulk and the source. This results in non-negligible leakage currents, causing an unwanted increase in the static consumption of the output stage. The same phenomenon (with inverted biasings) occurs in a P-channel transistor.

It has been provided to form an amplification stage of the type described in relation with FIG. 1, in which transistors 5 and 7 are provided with a bulk contacting area, the bulk of transistor 5 being connected to high reference voltage $VDD_E$, and the bulk of transistor 7 being connected to low reference voltage $GND_E$. This enables to overcome the above-mentioned disadvantages of off-state leakage currents and of switching time dispersion. However, the advantage of a fast switching due to the building up of electric charges in the bulk region is then lost.

It would be desirable to have an output stage in which power amplification transistors have switching times which are both short and with a small dispersion, as well as decreased leakage currents.

BRIEF SUMMARY OF THE DISCLOSURE

One embodiment is an output amplification stage of an integrated circuit chip formed inside and on top of an SOI-type substrate, at least partly overcoming some of the disadvantages of usual output amplification stages.

One embodiment is such a stage in which power transistors switch fast with respect to usual output stages.

One embodiment is such a stage in which the dispersion of the switching times of the power transistors is small as compared with that of usual output stages.

One embodiment is such a stage in which leakage currents in power transistors are small as compared with those of usual output stages.

One embodiment is such a stage which is easy and inexpensive to manufacture as compared with usual output stages.

One embodiment provides a method for controlling an output amplification stage comprising first and second complementary SOI-type MOS power transistors, in series between first and second power supply rails, the method comprising the steps of: connecting the bulk of the first transistor to the first rail when the first transistor is maintained in an off state; connecting the bulk of the second transistor to the second rail when the second transistor is maintained in an off state; and connecting the bulk of each of the transistors to the common node of said transistors, during periods when this transistor switches from an off state to an on state.

According to an embodiment, the first and second transistors respectively are a P-channel MOS transistor and an N-channel MOS transistor; the first and second rails respectively are a high power supply rail and a low power-supply rail; the sources of the first and second transistors are respectively connected to the first rail and to the second rail; and the drains of the first and second transistors are connected to the common node.

Another embodiment provides an output amplification stage comprising first and second SOI-type complementary MOS power transistors, respectively with a P channel and an N channel, in series between first and second rails, respectively of high and low power supply, wherein the sources of the first and second transistors are respectively connected to the first rail and to the second rail, and the drains of the first and second transistors are connected to a first common node, this stage further comprising: third and fourth P-channel MOS transistors in series between the first common node and the first rail, the node common to the third and fourth transistors being connected to the bulk of the first transistor; a first inverter having its input connected to the gate of the third transistor and having its output connected to the gate of the fourth transistor; fifth and sixth N-channel MOS transistors in series between the first common node and the second rail, the node common to the fifth and sixth transistors being connected to the bulk of the second transistor; and a second inverter having its input connected to the gate of the fifth transistor and having its output connected to the gate of the sixth transistor.

According to an embodiment, the gate of the third transistor is connected to the gate of the first transistor and the gate of the fifth transistor is connected to the gate of the second transistor.

According to an embodiment, the output amplification stage further comprises a pre-amplification stage receiving as an input a data signal provided by logic circuits of the chip, and providing control signals to the gates of the first and second transistors, and the gates of the third and fifth transistors are connected to intermediary nodes of the pre-amplification stage.

According to an embodiment, the third to sixth transistors are manufactured with the minimum gate width of the considered technology.

The foregoing and other features, and advantages will be discussed in detail in the following non-limiting description of specific embodiments in connection with the accompanying drawings.

BRIEF DESCRIPTION OF THE SEVERAL VIEWS OF THE DRAWINGS

FIG. 4 is a partial electric diagram of another example of an amplification stage associated with an output pad of an integrated circuit chip;

FIGS. 5A to 5C are timing diagrams illustrating the variation of various signals of the output stage of FIG. 4, in a switching of the data signal;

FIG. 6 is a partial electric diagram of an embodiment of an amplification stage associated with an output pad of an integrated circuit chip;

FIGS. 7A to 7C are timing diagrams illustrating the variation of various signals of the output stage of FIG. 6, in a switching of the data signal.

DETAILED DESCRIPTION

Figure 1:
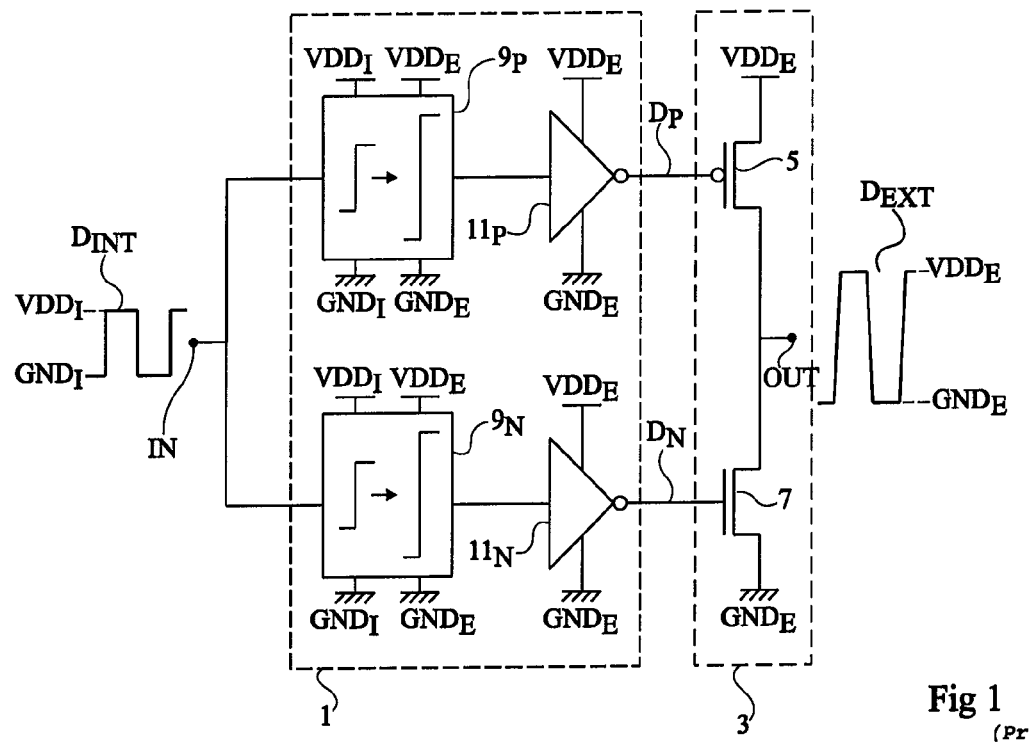
FIG. 1, previously described, is an electric diagram of an example of an amplification stage associated with an output pad of an integrated circuit chip.
Figures 2A, 2B, 2C:
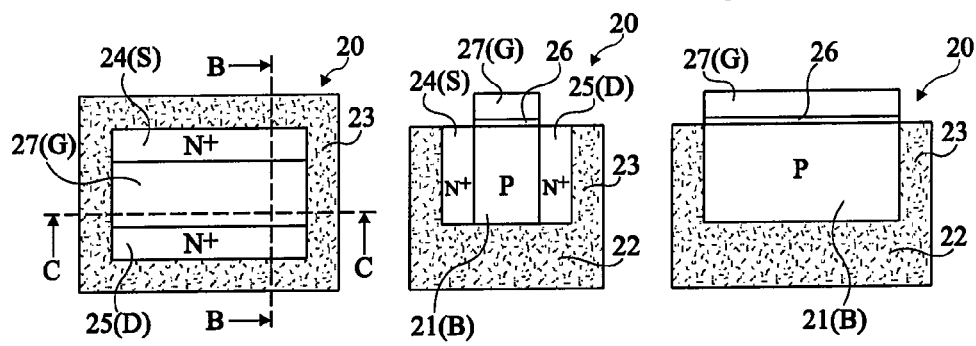
FIGS. 2A to 2C, previously described, schematically show an N-channel MOS transistor with a floating bulk, formed inside and on top of an SOI-type substrate.
Figures 3A, 3B, 3C:
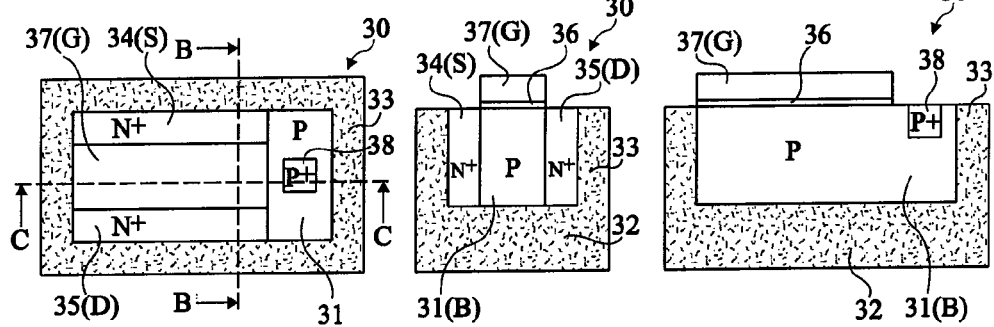
FIGS. 3A to 3C, previously described, schematically show an N-channel MOS transistor provided with a bulk biasing contacting area, formed inside and on top of an SOI-type substrate.

For clarity, the same elements have been designated with the same reference numerals in the different drawings.

FIG. 4 is a partial electric diagram of an example of an amplification stage associated with an output pad of an integrated circuit chip formed inside and on top of an SOI-type substrate. The output stage of FIG. 4 is similar to the output stage of FIG. 1. In particular, it comprises a pre-amplification stage (not shown in FIG. 4), providing control signals $D_P$ and $D_N$ to a power and impedance matching stage 40. Stage 40 comprises a P-channel MOS power transistor 5, in series with an N-channel MOS power transistor 7. The sources of transistors 5 and 7 are respectively connected to high $VDD_E$ and low $GND_E$ power supply rails and the drains of transistors 5 and 7 are connected to a node OUT connected to an output pad of the chip. Signals $D_P$ and $D_N$ provided by the pre-amplification stage respectively control the gate of transistor 5 and the gate of transistor 7.

Transistors 5 and 7 are provided with bulk biasing contacting areas. An N-channel MOS transistor 41, having its source connected to bulk $B_N$ of transistor 7 and its drain connected to node OUT is provided. The gate of transistor 41 is connected to the gate of transistor 7. A P-channel MOS transistor 43, having its source connected to bulk $B_P$ of transistor 5 and its drain connected to node OUT is further provided. The gate of transistor 43 is connected to the gate of transistor 5.

FIGS. 5A to 5C are timing diagrams illustrating the variation of various signals of the output stage of FIG. 4. FIG. 5A illustrates the variation of signal $D_N$ provided by the pre-amplification step, FIG. 5B illustrates the variation of output signal OUT, and FIG. 5C illustrates the variation of voltage $B_N$ of the bulk of transistor 7.

Between a time t0 and a time t1, subsequent to time t0, signal $D_N$ is set to a low state, substantially corresponding to voltage $GND_E$. It should be reminded that the difference between signals $D_P$ and $D_N$ mainly lies in delays introduced in the rising or falling edges of one and/or the other of the signals, to prevent transistors 5 and 7 from being on at the same time. In steady state, that is, outside of switching periods, signal $D_P$ is identical to signal $D_N$. Thus, during time interval t0-t1, transistor 7 is off and transistor 5 is on. Accordingly, signal OUT is in a high state, substantially corresponding to voltage $VDD_E$. Further, since signal $D_N$ is in a low state, transistor 41 is off. As a result, bulk voltage $B_N$ of transistor 7 remains floating.

Between time t1 and a time t2, subsequent to time t1, signal $D_N$ switches to a high state, close to $VDD_E$. Before the turning on of transistor 7, and thus the switching of signal OUT to a low state, the rise in voltage $D_N$ tends to turn on transistor 41. Voltage OUT still being in a high state, this results in raising bulk voltage $B_N$ of transistor 7. This rise in voltage $B_N$ promotes a fast switching of transistor 7. When transistors 7 and 5 respectively turn on and off, voltage OUT drops to a low state, close to $GND_E$, and voltage $B_N$ is substantially taken to the same low value.

Between time t2 and a time t3, subsequent to time t2, signals $D_N$ and $D_P$ are set to a high state, substantially corresponding to high voltage $VDD_E$. Thus, transistor 7 is on and transistor 5 is off. Accordingly, signal OUT is in a low state, substantially corresponding to voltage $GND_E$. Signal $D_N$ being in a high state, transistor 41 remains on. As a result, bulk $B_N$ of transistor 7 is substantially maintained at the same low voltage (close to $GND_E$) as node OUT.

The behavior of P-channel transistors 5 and 43 is similar, with inverted biasings.

An advantage of the output stage described in relation with FIGS. 4 and 5A to 5C is that, as compared with an output stage in which the power transistor bulks are constantly maintained at a high or low reference voltage, the switchings of transistors 5 and 7 are faster. Further, since bulk $B_N$ of transistor 7 is taken down to reference voltage $GND_E$ each time signal $D_N$ settles to a high state (that is, each time the data signal settles to a low state) and bulk $B_P$ of transistor 5 is taken to reference voltage $VDD_E$ each time signal $D_P$ settles to a low state (that is, each time the data signal settles to a high state), the history effect is decreased with respect to an output stage in which the power transistor bulks are purely floating.

However, bulk $B_N$ of transistor 7 remains floating when signal $D_N$ is set to a low state, that is, when transistor 7 is off, and bulk $B_P$ of transistor 5 remains floating when signal $D_P$ is set to a high state, that is, when transistor 5 is off. This results, on the one hand, in relatively high leakage currents and, on the other hand, in a switching time dispersion due to the history effect, which remains non-negligible.

FIG. 6 is a partial electric diagram of an embodiment of an amplification stage associated with an output pad of an integrated circuit chip formed inside and on top of an SOI-type substrate. Like the output stage of FIG. 4, the output stage of FIG. 6 comprises a pre-amplification stage, not shown, providing control signals $D_P$ and $D_N$ to a power and impedance matching stage 60. Stage 60 comprises a P-channel MOS power transistor 5, in series with an N-channel MOS power transistor 7. The sources of transistors 5 and 7 are respectively connected to high and low power supply rails, respectively $VDD_E$ and $GND_E$, and the drains of transistors 5 and 7 are connected to a node OUT connected to an output pad of the chip. Signals $D_P$ and $D_N$ provided by the pre-amplification stage respectively control the gate of transistors 5 and 7.

Transistors 5 and 7 are provided with bulk biasing contacting areas. Biasing means comprising two N-channel MOS transistors 61 and 63 are associated with the bulk of transistor 7. The source and the drain of transistor 61 are respectively connected to bulk $B_N$ of transistor 7 and to node OUT. The gate of transistor 61 is connected to the gate of transistor 7. The source and the drain of transistor 63 are respectively connected to low power supply rail $GND_E$ and to bulk $B_N$ of transistor 7. An inverter 65 having its input connected to the gate of transistor 61 and having its output connected to the gate of transistor 63 is provided. Further, biasing means comprising two P-channel MOS transistors 67 and 69 are associated with transistor 5. The source and the drain of transistor 67 are respectively connected to bulk $B_P$ of transistor 5 and to node OUT. The gate of transistor 67 is connected to the gate of transistor 5. The source and the drain of transistor 69 are respectively connected to high power supply rail $VDD_E$ and to bulk $B_P$ of transistor 5. An inverter 71 having its input connected to the gate of transistor 67 and having its output connected to the gate of transistor 69 is provided.

FIGS. 7A to 7C are timing diagrams illustrating the variation of various signals of the output stage of FIG. 6. FIG. 7A illustrates the variation of signal $D_N$ provided by the pre-amplification stage, FIG. 7B illustrates the variation of output signal OUT, and FIG. 7C illustrates the variation of voltage $B_N$ of the bulk of transistor 7.

Between a time t0 and a time t1, subsequent to time t0, signals $D_P$ and $D_N$ are set to a low state, substantially corresponding to voltage $GND_E$. Transistors 7 and 5 are thus respectively off and on, and signal OUT is in a high state, substantially corresponding to voltage $VDD_E$.

Further, since signal $D_N$ is in a low state, transistors 61 and 63 are respectively off and on. As a result, bulk voltage $B_N$ of transistor 7 is maintained substantially at voltage $GND_E$.

Between time t1 and a time t2, subsequent to time t1, signal $D_N$ switches to a high state. As soon as the beginning of the switching and before turning on transistor 7, and thus switching signal OUT to a low state, the rise in voltage $D_N$ tends to turn on transistor 61 and to turn off transistor 63. Voltage OUT still being in a high state, this results in raising bulk voltage $B_N$ of transistor 7. This rise in voltage $B_N$ promotes a fast switching of transistor 7. When transistors 7 and 5 respectively turn on and off, voltage OUT drops to a low state, close to $GND_E$, and voltage $B_N$ is taken down to the same low value.

Between time t2 and a time t3, subsequent to time t2, signals $D_N$ and $D_P$ are set to a high state, substantially corresponding to high voltage $VDD_E$. Thus, transistor 7 is on and transistor 5 is off. Accordingly, signal OUT is in a low state, substantially corresponding to voltage $GND_E$. Signal $D_N$ being in a high state, transistors 61 and 63 are respectively on and off. As a result, bulk $B_N$ of transistor 7 is substantially maintained at the same low voltage (close to $GND_E$) as node OUT.

The behavior of P-channel transistors 5, 67, and 69 is similar, with inverted biasings.

Transistors 61, 63, 67, and 69 are preferably manufactured with a minimum gate width, for example, the minimum gate width of the considered manufacturing technology, to switch faster than power transistors 5 and 7 when the data signal switches state. As an example, power transistors 5 and 7 may have a gate width approximately ranging from 100 to 200 μm, and transistors 61, 63, 67, and 69 may have a gate width on the order of 0.5 μm. The transistors of inverters 65 and 71 are also preferably formed with a small gate width as compared to the gate width of transistors 5 and 7.

An advantage of the output stage described in relation with FIGS. 6 and 7A to 7C is that, as compared with an output stage in which the power transistor bulks are constantly maintained at a high or low reference voltage, the switchings of transistors 5 and 7, and thus of signal OUT, are faster. Further, bulk $B_N$ of transistor 7 being taken to reference voltage $GND_E$ each time the data signal settles in a high or low state, and bulk $B_P$ of transistor 5 being taken to reference voltage $VDD_E$ each time the data signal settles to a high or low state, the history effect is suppressed with respect to an output stage where the bulks of the power transistors can remain floating. Moreover, since the power transistor bulks are, in steady state, connected to a reference voltage, off-state leakage currents are strongly decreased with respect to an output stage where the power transistor bulks can remain floating.

Thus, in the provided output amplification stage, the power transistors have both switching times which are short and with a small dispersion, and decreased leakage currents.

It should further be noted that transistors 61, 63, 67, and 69, as well as inverters 65 and 71, are of small size as compared with power transistors 5 and 7. Thus, the additional silicon surface area consumption is negligible with respect to that of an output stage in which the power transistor bulks are directly connected to the power supply rails.

The present inventors have implemented comparative tests bearing on four different output amplification stages A, B, C, and D. Stage A corresponds to the electric diagram of FIG. 1, but with power transistors 5 and 7 provided with bulk contacting areas, the bulk of transistor 5 being constantly connected to rail $VDD_E$ and the bulk of transistor 7 being constantly connected to rail $GND_E$. Stage B corresponds to the electric diagram of FIG. 1, power transistors 5 and 7 having a purely floating bulk. Stage C corresponds to the diagram of FIG. 4. Stage D corresponds to the diagram of FIG. 6. Stages A to D are provided with identical pre-amplification stages, corresponding to the electric diagram of FIG. 1.

For each of output stages A to D, the present inventors have measured the following characteristics: the average switching time of the output pad; the dispersion of the output pad switching times; and the current consumption of the output stage when the data signal settles to a constant high or low value, that is, outside of consumption periods.

The average switching times measured for stages B, C, and D respectively are shorter by 7%, 10%, and 10% than the average switching time of stage A. The switching time dispersions of stages A to D respectively are 5.9 ps, 20 ps, 15 ps, and 3.8 ps. The current consumptions of stages A to D (in steady state) respectively are 4.74 nA, 375 nA, 375 nA, and 4.78 nA.

Thus, the provided output amplification stage, described in relation with FIG. 6, cumulates both the advantage of a fast switching of the floating bulk transistors, and the advantages of repeatability of the switching times and of decreased leakage currents of the transistors having their bulk permanently connected to a reference voltage.

Figure 8:
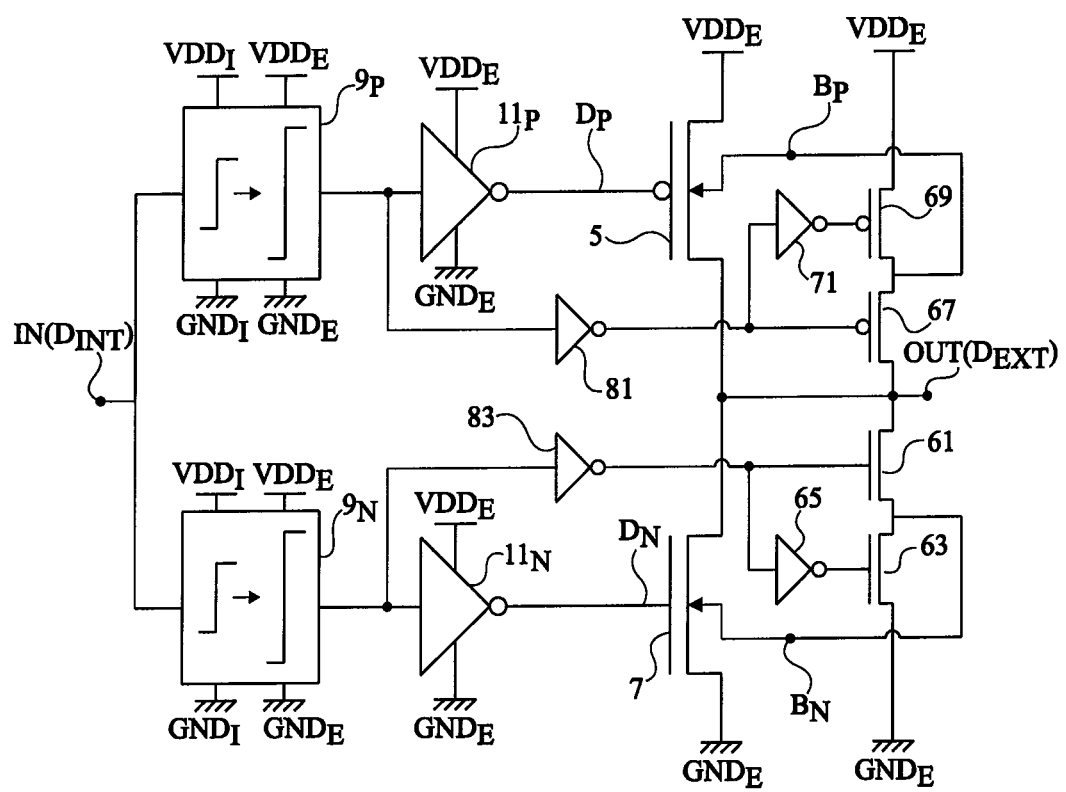
FIG. 8 is a partial electric diagram of an alternative embodiment of an amplification stage associated with an output pad of an integrated circuit chip.

FIG. 8 is a partial electric diagram of an alternative embodiment of an amplification stage associated with an output pad of an integrated circuit chip formed inside and on top of an SOI-type substrate. The output stage of FIG. 8 is of the same type as the output stage of FIG. 6, but differs from it in that the gate of transistor 61 and the input of inverter 65 are not connected to the gate of transistor 7, but, further upstream, to the output of voltage step-up circuit $9_N$. Similarly, the gate of transistor 67 and the input of inverter 71 are not connected to the gate of transistor 5, but to the output of voltage step-up circuit $9_P$. This enables transistors 61, 63, 67, and 69 to switch faster when the data signal switches state, and thus enables the bulk of transistors 5 and 7 to be biased faster. Inverters 81 and 83 are provided, respectively between the output of circuit 9P and the gate of transistor 67, and between the output of circuit 9N and the gate of transistor 61, so that the control signals of transistors 61, 63, 67, and 69 are in phase with signals $D_P$ and $D_N$. The gate of transistor 67 and the gate of transistor 61 may possibly be connected to a complementary output of circuit 9P and to a complementary output of circuit 9N, if such outputs are available.

Specific embodiments of the present disclosure have been described. Various alterations, modifications and improvements will readily occur to those skilled in the art.

In particular, the present disclosure is not limited to output stages comprising a pre-amplification stage of the type described in relation with FIG. 1. It will be within the abilities of those skilled in the art to implement the desired operation for other configurations of output stages comprising a power and impedance matching stage comprising two complementary MOS power transistors in series.

Further, the present disclosure is not limited to the examples described in relation with FIGS. 6 and 8 of circuits for biasing the bulks of transistors 5 and 7. It will be within the abilities of those skilled in the art to provide any other switching means capable of:

connecting bulk $B_P$ of transistor 5 to rail $VDD_E$ when transistor 5 is maintained in an off state, that is, when signal $D_{INT}$ is set to a low value;

connecting bulk $B_N$ of transistor 7 to rail $GND_E$ when transistor 7 is maintained in an off state, that is, when signal $D_{INT}$ is set to a high value;

connecting bulk $B_P$ of transistor 5 to node OUT during periods of switching of transistor 5 from an off state to an on state, that is, when signal $D_{INT}$ switches from a low state to a high state; and connecting bulk $B_N$ of transistor 7 to node OUT during periods of switching of transistor 7 from an off state to an on state, that is, when signal $D_{INT}$ switches from a high state to a low state.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method, comprising:
controlling an output amplification stage that includes complementary first and second MOS power transistors coupled between first and second power supply rails, the controlling including:
coupling a bulk of the first MOS power transistor to the first rail when the first MOS power transistor is maintained in an off state;
coupling a bulk of the second MOS power transistor to the second rail when the second MOS power transistor is maintained in an off state;
coupling the bulk of the first MOS power transistor to a common node of said transistors, during transition periods when the first MOS power transistor switches from an off state to an on state; and
coupling the bulk of the second MOS power transistor to the common node of said transistors, during transition periods when the second MOS power transistor switches from the off state to the on state, wherein the first and second MOS power transistors respectively are a P-channel MOS transistor and an N-channel MOS transistor; the first and second power supply rails respectively are a high power supply rail and a low power supply rail; the first and second transistors having respective sources that are respectively coupled to the first power supply rail and to the second power supply rail and respective drains that are coupled to the common node.

2. The method of claim 1, comprising:
coupling the bulk of the first MOS power transistor to the first power supply rail outside of the transition periods when the first MOS power transistor switches from the off state to the on state; and
coupling the bulk of the second MOS power transistor to the second power supply rail outside of the transition periods when the second MOS power transistor switches from the off state to the on state.

3. An output amplification stage, comprising:
a P-channel first transistor and an N-channel second transistor coupled between high and low power rails, wherein the first and second transistors have respective sources that are respectively coupled to the high power rail and to the low power rail and respective drains that are coupled to a first common node;
P-channel third and fourth transistors coupled between the first common node and the high power rail and coupled to each other at a second common node that is coupled to a bulk of the first transistor;
a first inverter having an input coupled to a gate of the third transistor and having an output coupled to a gate of the fourth transistor;
N-channel fifth and sixth transistors coupled between the first common node and the low power rail and coupled to each other at a third common node that is coupled to a bulk of the second transistor; and
a second inverter having an input coupled to a gate of the fifth transistor and having an output coupled to a gate of the sixth transistor.

4. The stage of claim 3, wherein a gate of the third transistor is coupled to a gate of the first transistor and the gate of the fifth transistor is coupled to a gate of the second transistor.

5. The stage of claim 3, further comprising a pre-amplification stage configured to receive an input data signal, and provide control signals to gates of the first and second transistors, wherein a gate of the third transistor and the gate of the fifth transistor are coupled to respective intermediary nodes of the pre-amplification stage.

6. The stage of claim 3, wherein the third to sixth transistors have smaller gate widths than gate widths of the first and second transistors.

7. The stage of claim 3, further comprising:
a first delay element having an input and an output, the input of the first delay element being electrically coupled to the input of the first inverter and a gate of the third transistor and the output of the first delay element being electrically coupled to a gate of the first transistor; and
a second delay element having an input and an output, the input of the second delay element being electrically coupled to the input of the second inverter and a gate of the fifth transistor and the output of the delay element being electrically coupled to a gate of the second transistor.

8. The stage of claim 7, further comprising:
a third inverter coupled between the input of the first delay element and the input of the first inverter; and
a fourth inverter coupled between the input of the second delay element and the input of the second inverter.

9. The stage of claim 3, wherein the first and second transistors are silicon-on-insulator power transistors.

10. A circuit, comprising:
complementary first and second transistors coupled between first and second power rails, wherein the first and second transistors are coupled to each other at a first common node;
a third transistor coupled between the first common node and a bulk of the first transistor, the first and third transistors having respective control terminals coupled to each other and the third transistor being configured to electrically couple the bulk of the first transistor to the first common node during first transition periods in which the first transistor switches from an off state to an on state; and
a fourth transistor coupled between the first common node and a bulk of the second transistor, the second and fourth transistors having respective control terminals coupled to each other and the fourth transistor being configured electrically couple the bulk of the second transistor to the first common node during second transition periods in which the second transistor switches from the off state to the on state.

11. The circuit of claim 10, further comprising:
a fifth transistor coupled with the third transistor between the first power supply rail and the first common node, the fifth transistor having a control terminal;
a first inverter having an input coupled to the control terminal of the first transistor and having an output coupled to the control terminal of the fifth transistor;
a sixth transistor coupled with the fourth transistor between the first common node and the second power supply rail, the sixth transistor having a control terminal; and
a second inverter having an input coupled to the control terminal of the second transistor and having an output coupled to the control terminal of the sixth transistor.

12. The circuit of claim 10, further comprising a pre-amplification stage configured to receive an input data signal, and provide control signals to the gates of the first and second transistors, wherein the control terminals of the third and fourth transistors are coupled to respective intermediary nodes of the pre-amplification stage.

13. The circuit of claim 10, wherein the third and fourth transistors have smaller gate widths than gate widths of the first and second transistors, the third transistor being configured to switch on faster than the first transistor switches on during the first transition periods and the fourth transistor being configured to switch on faster than the second transistor switches on during the second transition periods.

14. The circuit of claim 10, further comprising:
a first delay element having an input and an output, the input of the first delay element being electrically coupled to the input of the first inverter and the control terminal of the fifth transistor and the output of the first delay element being electrically coupled to the control terminal of the first transistor; and
a second delay element having an input and an output, the input of the second delay element being electrically coupled to the input of the second inverter and the control terminal of the sixth transistor and the output of the delay element being electrically coupled to the control terminal of the second transistor.

15. The circuit of claim 14, further comprising:
a third inverter coupled between the input of the first delay element and the input of the first inverter; and
a fourth inverter coupled between the input of the second delay element and the input of the second inverter.

16. The circuit of claim 10, wherein the first and second transistors are silicon-on-insulator power transistors.

* * * * *